US008241735B2

(12) United States Patent
Murashige et al.

(10) Patent No.: US 8,241,735 B2
(45) Date of Patent: Aug. 14, 2012

(54) SUBSTRATE FOR DISPLAY DEVICE AND METHOD OF MANUFACTURING THE SAME

(75) Inventors: Takeshi Murashige, Osaka (JP); Yoshimasa Sakata, Osaka (JP); Tatsuki Nagatsuka, Osaka (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 876 days.

(21) Appl. No.: 12/091,781

(22) PCT Filed: Sep. 6, 2007

(86) PCT No.: PCT/JP2007/067413
§ 371 (c)(1),
(2), (4) Date: Apr. 28, 2008

(87) PCT Pub. No.: WO2008/050547
PCT Pub. Date: May 2, 2008

(65) Prior Publication Data
US 2010/0062234 A1    Mar. 11, 2010

(30) Foreign Application Priority Data
Oct. 25, 2006    (JP) .................................. 2006-289439

(51) Int. Cl.
*B32B 7/02* (2006.01)
(52) U.S. Cl. ........ 428/212; 428/213; 428/220; 428/337; 428/417; 428/426
(58) Field of Classification Search .................. 428/213, 428/220, 337, 417, 426
See application file for complete search history.

(56) References Cited

U.S. PATENT DOCUMENTS

| 7,359,021 B2 | 4/2008 | Ota et al. |
| 2004/0141141 A1 | 7/2004 | Ota et al. |
| 2007/0122631 A1 | 5/2007 | Higuchi et al. |
| 2008/0160871 A1 | 7/2008 | Ota et al. |

FOREIGN PATENT DOCUMENTS

| JP | 4-212931 A | 8/1992 |
| JP | 2001-113631 A | 4/2001 |
| JP | 2001-162721 A | 6/2001 |
| JP | 2002-297054 A | 10/2002 |
| JP | 2004-050565 A | 2/2004 |
| JP | 2004-205976 A | 7/2004 |
| WO | 2005/047200 A1 | 5/2005 |

OTHER PUBLICATIONS

Furukawa et al (JP 2002-297054 machine translation), Oct. 9, 2002.*
International Search Report of PCT/JP2007/067413 date of mailing Nov. 20, 2007.
Chinese Office Action dated Sep. 1, 2011, issued in corresponding Chinese Patent Application No. 200780001300.X.

* cited by examiner

*Primary Examiner* — Maria Veronica Ewald
*Assistant Examiner* — Lawrence Ferguson
(74) *Attorney, Agent, or Firm* — Westerman, Hattori, Daniels & Adrian, LLP

(57) ABSTRACT

There is provided a substrate for a display device that has excellent gas barrier properties, flexibility, heat resistance and transparency, and has excellent dimensional stability, operability, and secondary processing characteristics. A substrate for a display device according to the present invention includes: an inorganic glass; and resin layers placed on both sides of the inorganic glass. Preferably, a ratio $d_{rsum}/d_g$ between a total thickness $d_{rsum}$ of the resin layer and a thickness $d_g$ of the inorganic glass is 0.5 to 2.2. Preferably, the resin layers on both sides of the inorganic glass are each composed of the same material, each have the same thickness, and a thickness of each of the resin layers is equal to the thickness of the inorganic glass. Preferably, an average coefficient of linear expansion at 170° C. of the substrate for a display device is 20 ppm ° $C.^{-1}$ or less.

7 Claims, 1 Drawing Sheet

SUBSTRATE FOR DISPLAY DEVICE AND METHOD OF MANUFACTURING THE SAME

TECHNICAL FIELD

The present invention relates to a substrate for a display device and a method of manufacturing the same. More specifically, the present invention relates to a substrate for a display device that has excellent gas barrier properties, flexibility, heat resistance and transparency, and has excellent dimensional stability, operability, and secondary processing characteristics, and a simple production method therefor.

BACKGROUND ART

Recently, due to development of an image communication technology, a liquid crystal display device is being enlarged in a case of a floor type, and is being reduced in weight and thickness in a case of a portable terminal type. In the future, in order to realize a curved surface display of a large panel having a high realistic sensation and a take-up type portable terminal pursuing for portability and convenience, it is dispensable to make a substrate flexible as well as to reduce the thickness and weight thereof.

Conventionally, a glass substrate has been used in most cases as a substrate of a liquid crystal display device. A glass substrate has not only excellent transparency, solvent resistance, and gas barrier properties, but also high heat resistance sufficiently for withstanding a photoetching process, sputtering, and the like in the step of forming an alignment film and the step of forming an electrode in the production process of the liquid crystal device. However, when an attempt is made so as to reduce the thickness of a glass material constituting a glass substrate so that the glass substrate can be curved, shock resistance thereof becomes insufficient, which makes it difficult to handle the glass substrate.

The technology of using a resin film or a resin sheet, which has excellent shock resistance and is more light-weight and more excellent in flexibility than glass, in a base of a substrate for a display is being developed. However, a conventional resin substrate for a display device has heat resistance lower than that of an inorganic material such as glass. Therefore, particularly in the application to a thin film transistor (which may also be referred to as a TFT) substrate requiring a high-temperature process, a problem has been indicated that cracks are formed in electrodes to increase a resistance and cause disconnection.

When a resin having a high conjugate structure in which an aromatic ring or a hetero ring is incorporated into a main chain is used in order to enhance heat resistance, a substrate is colored necessarily, which makes it impossible to obtain sufficient display performance. As a resin substrate having transparency with heat resistance being considered, polycarbonate, polyarylate, polyethersulfon, or the like has been discussed. However, such a resin substrate still has insufficient heat expansibility (coefficient of linear expansion: dimensional stability) (specifically, the coefficient of linear expansion of a resin substrate is about 50 ppm° $C.^{-1}$, which is about 10 times that of no-alkali glass for a display). Further, in the case of using a resin substrate, it is necessary to form a gas barrier layer on the surface thereof, which leads to increase in number of production steps, thereby causing problems such as the decrease in yield and the increase in cost.

On the other hand, a laminate substrate having an inorganic glass layer and a silicon oxide polymer layer has been proposed (for example, see Patent Document 1). According to Patent Document 1, the laminate substrate has excellent gas barrier properties, flexibility, heat resistance, and transparency. However, the laminate substrate in Patent Document 1 still has insufficient heat expansibility, and also has insufficient secondary processing characteristics and operability.

Patent Document 1: JP 2004-50565 A

DISCLOSURE OF THE INVENTION

Problems to be Solved by the Invention

The present invention has been made in view of solving the conventional problems as described above, and it is therefore an object of the present invention to provide a substrate for a display device that has excellent gas barrier properties, flexibility, heat resistance and transparency, and has excellent dimensional stability, operability, and secondary processing characteristics, and a simple production method therefor.

Means for Solving the Problems

A substrate for a display device according to an embodiment of the present invention includes: an inorganic glass; and resin layers placed on both sides of the inorganic glass.

In one embodiment of the invention, a ratio $d_{rsum}/d_g$ between a total thickness $d_{rsum}$ of the resin layer and a thickness $d_g$ of the inorganic glass is 0.5 to 2.2.

In another embodiment of the invention, the resin layers on both sides of the inorganic glass are each composed of the same material, each have the same thickness, and a thickness of each of the resin layers is equal to the thickness of the inorganic glass.

In still another embodiment of the invention, a total thickness of the substrate for a display device is 150 µm or less.

In still another embodiment of the invention, an average coefficient of linear expansion at 170° C. of the substrate for a display device is 20 ppm° $C.^{-1}$ or less. In still another embodiment of the invention, a rupture diameter is 30 mm or less when the substrate for a display device is curved. In still another embodiment of the invention, a transmittance of the substrate for a display device is 85% or more.

In still another embodiment of the invention, the thickness $d_g$ of the inorganic glass is 1 µm to 50 µm.

In still another embodiment of the invention, the resin layer is formed of a resin composition containing an epoxy resin as a main component.

In still another embodiment of the invention, a Young's modulus at 25° C. of the resin layer is 1 GPa or more.

In still another embodiment of the invention, the resin layer is directly provided on the inorganic glass.

According to another aspect of the present invention, a method of manufacturing a substrate for a display device is provided. The method includes: attaching a resin composition in a semi-cured state to an inorganic glass; and completely curing the resin composition attached to the inorganic glass.

Effects of the Invention

According to the present invention, a substrate for a display device having resin layers on both sides of an inorganic glass is provided. In the substrate, the inorganic glass placed in a center portion functions as a gas barrier layer, so it is not necessary to laminate a gas barrier layer additionally, which can contribute to the reduction in thickness of the substrate. Further, the inorganic glass placed in the center portion suppresses the thermal expansion of the resin layers which originally must have a high coefficient of linear expansion, and hence, a substrate with a small coefficient of linear expansion can be obtained as a laminate. Therefore, the substrate for a display device of the present invention is particularly effective as a TFT substrate requiring a high-temperature process. Further, the rupture of an inorganic glass plate is generally considered to be caused by the concentration of a stress on minute defects on a surface thereof, and the rupture of the inorganic glass plate is more likely to occur as the thickness thereof is reduced. Therefore, it is difficult to reduce the thickness of inorganic glass. On the other hand, in the substrate for a display device according to an embodiment of the present invention, the resin layers placed on both sides alleviate the stress in a tearing direction causing defects during deformation. Therefore, even in the case where the inorganic glass is reduced in thickness, cracks and rupture are unlikely to occur in the inorganic glass, which makes it possible to reduce the thickness and weight further. It was found for the first time by the inventors of the present invention that such effects are obtained by laminating resin layers on both surfaces of inorganic glass, and the effects are unexpected excellent effects.

DESCRIPTION OF REFERENCE NUMERALS

10 Inorganic glass
11,11' Resin layer
12,12' Adhesion layer
100 Substrate for display device

BEST MODE FOR CARRYING OUT THE INVENTION

A. Entire Configuration of a Substrate for a Display Device

Figure 1A:
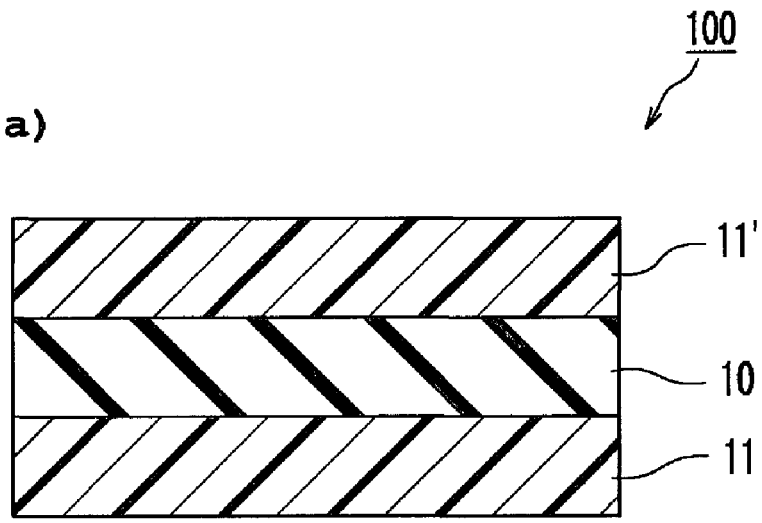
FIG. 1(a) Schematic cross-sectional view of a substrate for a display device according to a preferred embodiment of the present invention.

FIG. 1(a) is a schematic cross-sectional view of a substrate for a display device according to a preferred embodiment of the present invention. A substrate for a display device 100 includes inorganic glass 10 and resin layers 11, 11' placed on both sides of the inorganic glass 10. Due to such a configuration, a substrate for a display device having excellent gas barrier properties, flexibility, heat resistance, and transparency, and having excellent dimensional stability, operability, and secondary processing characteristics is obtained. More preferably, the resin layers 11 and 11' on both sides are composed of the same material, and have the same thickness (specifically, the substrate for a display device has a configuration of a so-called symmetric arrangement). Due to such a configuration, a substrate having a smaller coefficient of linear expansion and having very good operability and secondary processing characteristics can be obtained.

Figure 1B:
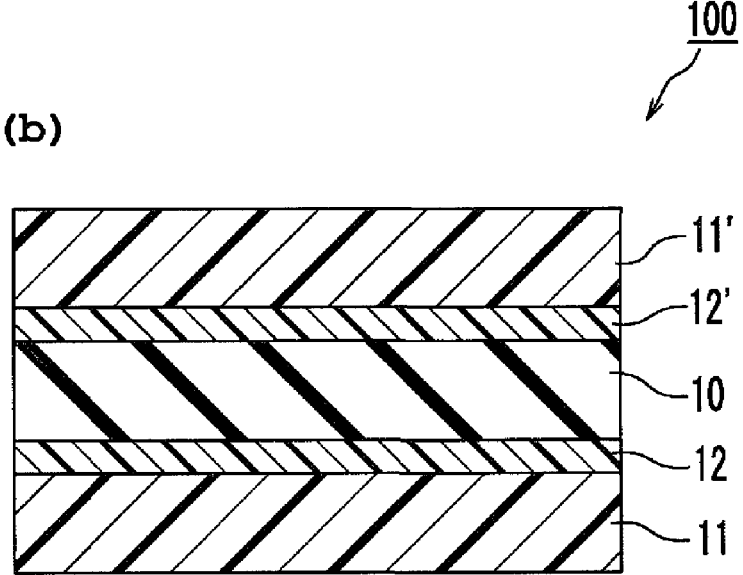
FIG. 1(b) Schematic cross-sectional view of a substrate for a display device according to another embodiment of the present invention.

Preferably, as shown in FIG. 1(a), the respective resin layers 11, 11' are provided on the inorganic glass 10 directly (that is, without an adhesion layer interposed therebetween). Due to such a configuration, a thinner substrate can be realized. A substrate for a display device having such a configuration can be produced by a production method described later. If required, as shown in FIG. 1(b), the respective resin layers 11, 11' may be fixed to the glass substrate via adhesion layers 12, 12'. The adhesion layer is composed of any suitable adhesive or pressure-sensitive adhesive.

A radio $d_{rsum}/d_g$ between a total thickness $d_{rsum}$ of the above resin layer and a thickness $d_g$ of the above inorganic glass is preferably 0.5 to 2.2, more preferably 1.5 to 2.1, and particularly preferably about 2. Due to such a relationship between the total thickness of the resin layer and the thickness of the inorganic glass, a warp and a wave of a substrate during heat treatment can be suppressed satisfactorily. Especially preferably, the substrate has a configuration of a symmetric arrangement, and a difference $(d_r-d_g)$ between the thickness $d_r$ of each resin layer and the thickness $d_g$ of the above inorganic glass is preferably −45 μm to 20 μm, more preferably −35 μm to 10 μm, and most preferably, $d_r$ and $d_g$ are equal. Due to such a configuration, the above substrate for a display device is very unlikely to be warped or waved since heat stress is applied to both surfaces of the inorganic glass equally even if the substrate is subjected to heat treatment. As used herein, "equal" includes the case "substantially equal" as well as the case of strict equality.

The total thickness of the above substrate for a display device is preferably 150 μm or less, and more preferably 50 μm to 100 μm. According to the present invention, due to the above configuration, the thickness of the inorganic glass can be reduced remarkably compared with that of the conventional glass substrate. Consequently, a light-weight and thin substrate for a display device having excellent flexibility can be obtained.

The average coefficient of linear expansion at 170° C. of the above substrate for a display device is preferably 20 ppm° $C.^{-1}$ or less, and more preferably 10 ppm° $C.^{-1}$ or less. In the above range, for example, in the case of using the substrate in a liquid crystal display device, even when the substrate is subjected to a plurality of heat treatment steps, the displacement of pixels, and the rupture and cracks of wiring are unlikely to occur.

The rupture diameter of the above substrate for a display device when curved is preferably 30 mm or less, and more preferably 10 mm or less.

The transmittance of the above substrate for a display device at a wavelength of 550 nm is preferably 85% or more, and more preferably 90% or more. Preferably, the reduction ratio of light transmittance of the above substrate for a display device after the heat treatment at 180° C. for 2 hours is within 5%. This is because, with such a reduction ratio, the practically acceptable light transmittance can be kept, for example, even if a heat treatment required in a production process of a liquid crystal display device is conducted. One of the effects of the present invention is that such characteristics are realized while adopting a resin layer.

A surface roughness Ra (substantially, a surface roughness Ra of a resin layer of a substrate) of the above substrate for a display device is preferably 50 nm or less, and more preferably 30 nm or less. The wave of the above substrate for a display device is preferably 0.5 μm or less, and more preferably 0.1 μm or less. The substrate for a display device with such characteristics has excellent quality. Such characteristics can be realized, for example, by a production method described later.

An in-plane retardation Re(550) of the above substrate for a display device at a wavelength of 550 nm is preferably 10 nm or less, and more preferably 5 nm or less. A thickness direction retardation Rth(550) of the above substrate for a display device at a wavelength of 550 nm is preferably 20 nm or less, and more preferably 10 nm or less. If the optical characteristics are in the above range, for example, even in the case of using a substrate in a liquid crystal display apparatus, the display characteristics will not be adversely influenced. One of the effects of the present invention is that such characteristics are realized while adopting a resin layer. An in-plane retardation Re(λ) and a thickness direction retardation Rth(λ) at a wavelength of A are respectively obtained by the expressions as indicated below. In the expressions, nx represents a refractive index in a slow axis direction, ny represents a refractive index in a fast axis direction, nz represents refractive index in a thickness direction, and d represents a thickness. The slow axis indicates a direction in which a refractive index becomes maximum in a plane, and the fast axis indicates a direction perpendicular to the slow axis in the same plane.

$$Re(\lambda)=(nx-ny)\times d$$

$$Rth(\lambda)=(nx-nz)\times d$$

B. Inorganic Glass

As the inorganic glass used in the substrate for a display device of the present invention, any suitable glass can be adopted as long as it is in a plate shape. Examples of the above inorganic glass include soda-lime glass, borate glass, aluminosilicate glass, and quartz glass according to the classification based on a composition. Further, according to the classification based on an alkali component, examples of the inorganic glass include no-alkali glass and low alkali glass. The content of an alkali metal component (e.g., $Na_2O$, $K_2O$, $Li_1O$) of the above inorganic glass is preferably 15% by weight or less, and more preferably 10% by weight or less.

The thickness of the above inorganic glass is preferably 1 µm to 100 µm, more preferably 10 µm to 70 µm, and particularly preferably 25 µm to 55 µm. In the present invention, the thickness of the inorganic glass can be reduced by placing resin layers on both sides of the inorganic glass.

The transmittance of the above inorganic glass at a wavelength of 550 nm is preferably 90% or more. A refractive index $n_g$ of the above inorganic glass at a wavelength of 550 nm is preferably 1.4 to 1.6.

An average coefficient of thermal expansion of the above inorganic glass is preferably 10 ppm° $C.^{-1}$ to 0.5 ppm° $C.^{-1}$, and more preferably 5 ppm° $C.^{-1}$ to 0.5 ppm° $C.^{-1}$. The inorganic glass in the above range can suppress a change in dimension of a resin layer effectively in a high-temperature or low-temperature environment.

The density of the above inorganic glass is preferably 2.3 g/cm³ to 3.0 g/cm³, and more preferably 2.3 g/cm³ to 2.7 g/cm³. With the inorganic glass in the above range, a lightweight substrate for a display device is obtained.

As a method of forming the above inorganic glass, any suitable method can be adopted. Typically, the above inorganic glass is produced by melting a mixture containing a main material such as silica and alumina, an antifoaming agent such as salt cake and antimony oxide, and a reducing agent such as carbon at a temperature of 1,400° C. to 1,600° C. to form a thin plate, followed by cooling. Examples of the method of forming a thin plate of the above inorganic glass include a slot down draw method, a fusion method, and a float method. The inorganic glass formed into a plate shape by those methods may be chemically polished with a solvent such as hydrofluoric acid, if required, in order to reduce the thickness and enhance smoothness.

As the above-mentioned inorganic glass, commercially available glass may be used as it is, or commercially available inorganic glass may be polished to have a desired thickness. The commercially available inorganic glass include "7059", "1737", or "EAGLE 2000" manufactured by Corning Incorporated, "AN100" manufactured by Asahi Glass Co., Ltd., "NA-35" manufactured by NH Technoglass Corporation, and "OA-10" manufactured by Nippon Electric Glass Co., Ltd.

C. Resin Layer

The resin layers used in the substrate for a display device of the present invention are placed on both surfaces of the above inorganic glass. A thickness $d_r$ of the resin layer is preferably 1 µm to 100 µm, and more preferably 1 µm to 50 µm. The thickness of each resin layer may be the same or different. Preferably, the thickness of each resin layer is the same as described above. Further, each resin layer may be composed of the same material or different materials. Preferably, each resin layer is composed of the same material. Thus, most preferably, each resin layer is composed of the same material with the same thickness. The total thickness $d_{rsum}$ of the above resin layers is preferably 2 µm to 200 µm, and more preferably 2 µm to 100 µm.

A transmittance of the above resin layer at a wavelength of 550 nm is preferably 85% or more. A refractive index $(n_r)$ of the above resin layer at a wavelength of 550 nm is preferably 1.3 to 1.7. The difference between the refractive index $(n_r)$ of the above resin layer and a refractive index $(n_g)$ of the above inorganic glass is preferably 0.2 or less, and more preferably 0.1 or less. In the range, the adverse influence on the display characteristics caused by the difference in refractive index between the inorganic glass and the resin layer can be prevented.

The elastic moduli (Young's moduli) of the above resin layers are preferably 1 GPa or more, and more preferably 1.5 GPa or more, respectively. In the above range, even when the inorganic glass is made thin, the stress in a tearing direction causing the defects during deformation is alleviated by the resin layers, so cracks and rupture of the inorganic glass are unlikely to occur.

As a material forming the above resin layers, any suitable resin (substantially, a resin composition containing the resin as a main component: hereinafter, a resin and a resin composition may be referred to as a "resin" collectively) can be adopted. A resin having excellent heat resistance is preferred. More preferably, the above resin is of a thermosetting type or a UV-curable type. Examples of the resin include a polyethersulfon resin, a polycarbonate resin, an epoxy resin, an acrylic resin, and a polyolefin resin. Particularly preferably, the above resin layers are formed of a resin composition containing an epoxy resin as a main component. This is because a resin layer having excellent surface smoothness and exhibiting a satisfactory hue is obtained.

As the above epoxy resin, any suitable resin can be used as long as the resin has an epoxy group in molecules. Examples of the above epoxy resin include bisphenol types such as a bisphenol A type, a bisphenol F type, a bisphenol S type, and a hydrogenated substance thereof; novolac types such as a phenol novolac type and a cresol novolac type; nitrogen-containing cyclic types such as a triglycidylisocyanurate type and a hydantoin type; alicyclic types; aliphatic types; aromatic types such as a naphthalene type and a biphenyl type; glycidyl types such as a glycidyl ether type, glycidyl amine type, and glycidyl ester type; dicyclo types such as a dicyclopentadiene type; ester types; ether ester types; and modified types thereof. These epoxy resins can be used alone or in combination of two or more.

Preferably, the above epoxy resin is a bisphenol A-type epoxy resin, an alicyclic-type epoxy resin, a nitrogen-containing cyclic-type epoxy resin, or a glycidyl-type epoxy resin. In the case where the above epoxy resin is a nitrogen-containing cyclic type, the epoxy resin is preferably a triglycidylisocyanurate-type epoxy resin. Those epoxy resins have excellent discoloration preventive characteristics.

Preferably, the above resin layer is a cured layer of at least one kind of an epoxy prepolymer selected from the group consisting of the following general formulae (I), (II), (III), and (IV).

[Chemical Formula 1]

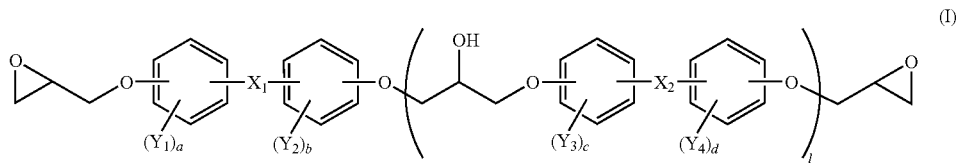

In the above Expression (I), $X_1$ and $X_2$ each independently represent a covalent bond, a $CH_2$ group, a $C(CH_3)_2$ group, a $C(CF_3)_2$ group, a CO group, an oxygen atom, a nitrogen atom, a $SO_2$ group, a $Si(CH_2CH_3)_2$ group, or a $N(CH_3)$ group. $Y_1$ to $Y_4$ each represent substituents, and a to d each represent a substitution number. $Y_1$ to $Y_4$ each independently represent a hydrogen atom, a halogen atom, an alkyl group containing 1 to 4 carbon atoms, a substituted alkyl group containing 1 to 4 carbon atoms, a nitro group, a cyano group, a thioalkyl group, an alkoxy group, an aryl group, a substituted aryl group, an alkylester group, or a substituted alkylester group. a to d each represent an integer of 0 to 4, and l represents an integer of 2 or more.

[Chemical Formula 2]

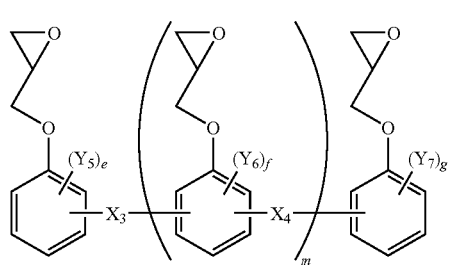

In the above Expression (II), $X_3$ and $X_4$ each independently represent a $CH_2$ group, a $C(CH_3)_2$ group, a $C(CF_3)_2$ group, a CO group, an oxygen atom, a nitrogen atom, a $SO_2$ group, a $Si(CH_2CH_3)_2$ group, or a $N(CH_3)$ group. $Y_5$ to $Y_7$ represent substituents, and e to g represent a substitution number. $Y_5$ to $Y_7$ each independently represent a hydrogen atom, a halogen atom, an alkyl group containing 1 to 4 carbon atoms, a substituted alkyl group containing 1 to 4 carbon atoms, a nitro group, a cyano group, a thioalkyl group, an alkoxy group, an aryl group, a substituted aryl group, an alkylester group, or a substituted alkylester group. e and g each represent an integer of 0 to 4, f represents an integer of 0 to 3, and m represents an integer of 2 or more.

[Chemical Formula 3]

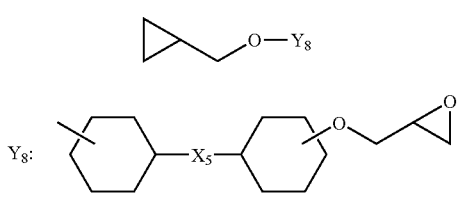

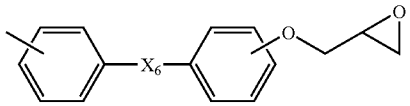

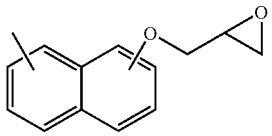

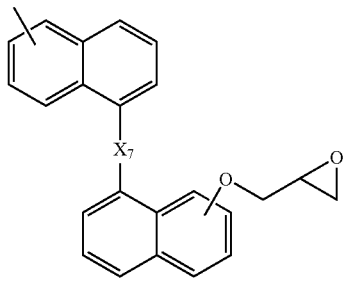

In the above Expression (III), $X_5$ to $X_7$ each independently represent a covalent bond, a $CH_2$ group, a $C(CH_3)_2$ group, a $C(CF_3)_2$ group, a CO group, an oxygen atom, a nitrogen atom, a $SO_2$ group, a $Si(CH_2CH_3)_2$ group, or a $N(CH_3)$ group. $Y_8$ represents any one of the above Expressions (a) to (d).

[Chemical Formula 4]

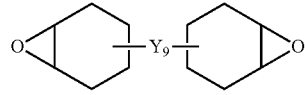

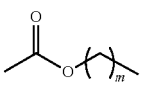

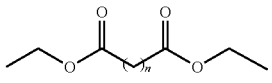

In the above Expression (IV), n and m each represent an integer of 1 to 6. $Y_9$ is a portion represented by the above Expression (a) or (b).

The epoxy equivalence (mass per epoxy group) of the above epoxy resin is preferably 100 g/eqiv. to 1,000 g/eqiv. In the above range, the flexibility and strength of a resin layer to be obtained can be enhanced.

The softening point of the above epoxy resin is preferably 120° or less. Further, the above epoxy resin is preferably a liquid at room temperature (e.g., 5 to 35° C.). More preferably, the above epoxy resin is a two-liquid mixed type epoxy resin that is a liquid at an application temperature or less (particularly at room temperature). This is because such a resin has excellent development characteristics and application characteristics when a resin layer is formed.

The above resin composition can further contain any suitable additive in accordance with the purpose. Examples of the additive include a curing agent, a curing-accelerating agent, a diluent, an antioxidant, a denaturant, a surfactant, a dye, a pigment, a discoloration preventing agent, a UV absorber, a softening agent, a stabilizer, a plasticizer, and an antifoaming agent. The kind, number, and amount of an additive to be contained in a resin composition can be set appropriately in accordance with the purpose.

As the above resin composition, a commercially available product may be used as it is, and a commercially available product to which any additive and/or resin are added may be used. Examples of the commercially available epoxy resin (resin composition) include Grade 827 and Grade 828 manufactured by Japan Epoxy Resin Co., Ltd., and EP Series and KR Series manufactured by Adeka Corporation.

D. Production Method of a Substrate for a Display Device

The production method of a substrate for a display device of the present invention includes attaching a resin composition in a semi-cured state to an inorganic glass and completely curing the resin composition attached to the inorganic glass. According to the production method, the resin layer can be directly fixed to the inorganic glass without an adhesion layer.

In one embodiment, the production method of a substrate for a display device of the present invention includes applying a resin composition onto a release film, semi-curing the resin composition to form a semi-cured layer, attaching the semi-cured layer to an inorganic glass, applying the resin composition to the side of the inorganic glass on which the semi-cured layer is not attached, and completely curing the semi-cured layer and the applied resin composition to form resin layers on both sides of the inorganic glass. In another embodiment, the production method of a substrate for a display device of the present invention includes preparing two laminates each including a release film/semi-cured layer, attaching the semi-cured layer of each laminate to each side of the inorganic glass, and completely curing the semi-cured layers on both sides of the inorganic glass to form resin layers.

The above resin composition is as described in the above section C.

Examples of a method of applying the above resin composition include coating methods such as air doctor coating, blade coating, knife coating, reverse coating, transfer roll coating, gravure roll coating, kiss coating, cast coating, spray coating, slot orifice coating, calendar coating, electrodeposition coating, dip coating, and die coating, and printing methods including relief printings such as flexographic printing, intaglio printings such as direct gravure printing and offset gravure printing, planographic printings such as offset printing, and stencil printings such as screen printing.

For application, a leveling agent such as silicone oil and an additive such as a curing agent are added to a resin composition, if required, whereby the application suitability of an application liquid and the printing suitability of ink can be enhanced. Further, by subjecting an inorganic glass surface to silane treatment or mixing a silane coupling agent with a resin composition, the adhesion between the inorganic glass and the application resin composition (as a result, a resin layer) can be enhanced.

A typical example of the above silane coupling agent includes aminosilane. Specific examples of aminosilane include γ-aminopropyltriethoxysilane, γ-aminopropyltrimethoxysilane, N-β-(aminoethyl)-γ-aminopropyltrimethoxysilane, γ-ureidopropyltriethoxysilane, and γ-N-phenylaminopropyltrimethoxysilane. Those aminosilanes can be used alone or in combination of two or more. Further, a coupling agent other than aminosilane may be used together with the silane coupling agent.

The above laminate (release film/semi-cured layer) and the inorganic glass are attached to each other by any suitable means. Typically, laminating is conducted. For example, by continuously supplying a roll-shaped laminate to the inorganic glass to conduct laminating in the case of attaching laminates to both sides of the inorganic glass, a substrate for a display device can be produced at an excellent production efficiency.

A method of curing the above resin composition can be selected appropriately in accordance with the kind of an epoxy resin contained in a resin composition. In the case where the epoxy resin is a thermosetting type, the resin composition is semi-cured and completely cured by heating. A heating condition can be selected appropriately in accordance with the kind of the epoxy resin, the composition of the resin composition, and the like. In one embodiment, the heating condition for semi-curing the applied resin composition is a temperature of 100° C. to 150° C. and a heating time of 5 to 30 minutes. In one embodiment, the heating condition for completely curing a semi-cured layer is a temperature of 170° C. to 200° C. and a heating time of 60 minutes or more. In the case where the epoxy resin is a UV-curable type, the resin composition is semi-cured and completely cured by irradiation with a UV-ray. An irradiation condition can be selected appropriately in accordance with the kind of an epoxy resin, the composition of a resin composition, and the like. In one embodiment, the irradiation condition for semi-curing the applied resin composition is an irradiation intensity of 40 $mW/cm^2$ to 60 $mW/cm^2$ and an irradiation time of 3 to 15 seconds. In one embodiment, the irradiation condition for completely curing a semi-cured layer is an irradiation intensity of 40 $mW/cm^2$ to 60 $mW/cm^2$ and an irradiation time of 5 to 30 minutes. If required, heat treatment may be conducted after irradiation with a UV-ray for completely curing a semi-cured layer. The condition of the heat treatment in this case is, for example, a temperature of 130° C. to 150° C. and a heating time of 10 to 60 minutes.

In the above, the embodiment in which the resin composition in a semi-cured state is attached to the inorganic glass has been described. However, needless to say, in the present invention, the completely cured resin composition (resin layer) maybe attached to the inorganic glass. In this case, any suitable adhesion layer can be used, if required.

E. Use

The substrate for a display device of the present invention can be used for any suitable display device. Examples of the display device include a liquid crystal display, a plasma display, and an organic EL display. Of those, the substrate for a display device of the present invention is preferred for a liquid crystal display.

In the case where the substrate for a display device of the present invention is used for a liquid crystal display, the substrate for a display device of the present invention can be adapted for forming an electrode corresponding to all the driving systems such as a segment system, a simple matrix system, and an active matrix system using a TFT by using a conventional process performed with respect to a glass substrate as it is, and can also be used for both of a transmission type display system and a reflection type display system. Those display apparatuses are incorporated into the following equipment as display apparatuses for small portable information terminal equipment, and display apparatuses for information equipment such as a word processor, a personal computer, and a work station, business equipment, and a large panel.

Hereinafter, the present invention will be described specifically by way of an example. However, the present invention is not limited to those examples. A method of evaluating a substrate for a display device of the example will be described below.

(1) Thickness:

A thickness was measured using a digital micrometer "KC-351C type" manufactured by Amitsu Corporation.

(2) Average Coefficient of Linear Expansion:

A TMA value (μm) at 30° C. to 170° C. was measured using TMA/SS150C (Seiko Instrument Inc.), whereby an average coefficient of linear expansion was calculated.

(3) Light Transmittance:

A transmittance at a wavelength of 550 nm was measured using a high-speed spectrophotometer (CMS-500, using a halogen lamp manufactured by Murakami Color Research Laboratory Co., Ltd.).

(4) Rupture Diameter:

Substrates (size: 10 mm×50 mm, sample number: 5) were wound around cylinders having different diameters, rupture of inorganic glass was visually checked, and an average of the diameters of the cylinders for 5 samples with rupture confirmed was set to be a rupture diameter.

(5) Young's Modulus

A measurement sample (25 mm×50 mm) was cut out from a resin film with a thickness of 50 μm, and a Young's modulus was calculated from a stress-distortion curve when a tensile load up to 20 N was applied to the measurement sample, using an autograph (manufactured by Shimadzu Corporation).

(6) In-Plane Retardation and Thickness Direction Retardation:

An in-plane retardation and a thickness direction retardation were measured at 23° C. and a wavelength of 550 nm using "AxoScan" manufactured by Axometrics. As an average refractive index, a value measured using an Abbe refractometer [Product name "DR-M4" manufactured by Atago Co., Ltd.] was used.

EXAMPLE

A resin composition containing, as a main component, an epoxy resin ((1):(2)=50:50 (weight ratio)) represented by the below-indicated chemical formula was interposed between release films subjected to silicone treatment, and passed between metal rolls fixed at an interval of 50 μm, whereby a laminate including an epoxy resin layer with a thickness of 30 μm was obtained. Next, a UV-ray was radiated (irradiation energy: 250 mJ/cm²) from one side of the above laminate using a UV-irradiation apparatus (conveyer rate: 2.5 m/min.) to semi-cure an epoxy resin layer, whereby a semi-cured layer was formed. Next, one release film was removed, and the semi-cured layer of the above laminate was attached to the surface on one side of inorganic glass (borosilicate glass with a thickness of 30 μm manufactured by Matsunami Glass Ind. Ltd.) using a laminator. The same operation was conducted with respect to the other side of the inorganic glass, and the semi-cured layer was attached thereto. Then, the remaining release film was removed, and thereafter, an UV-ray was radiated again (irradiation energy: 5,000 mJ/cm² or more). After that, a heat treatment (130° C. or more for 10 minutes or longer) was conducted, whereby the semi-cured layers on both surfaces of the inorganic glass were completely cured. Thus, a substrate for a display device having a configuration of a resin layer (30 μm)/inorganic glass (30 μm) /resin layer (30 μm) was obtained.

[Chemical Formula 5]

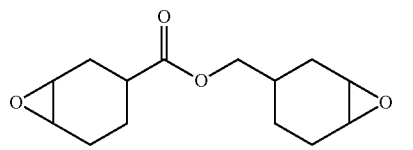

(1)

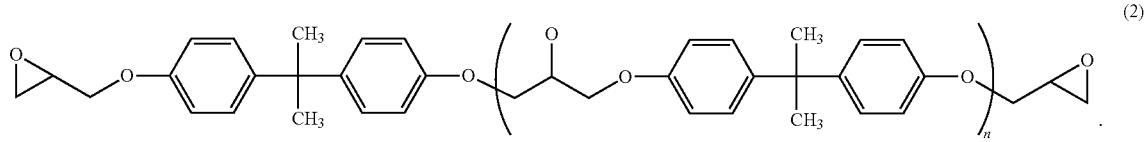

(2)

The coefficient of linear expansion, transmittance, and bend resistance of the obtained substrate for a display device, and the Young's modulus of the resin layer are shown in the following table.

TABLE 1

| | |
|---|---|
| Thickness (μm) | About 90 |
| Average coefficient of linear expansion (ppm° c.⁻¹) | 10 |
| Light transmittance (%) | 90 |
| Rupture diameter (mm) | 20 |
| Young's modulus (GPa) | 2.5 |
| In-plane retardation (nm) | 0.5 |
| Thickness direction retardation (nm) | 20 |

INDUSTRIAL APPLICABILITY

The substrate for a display device of the present invention can be used widely for a display device for, for example, a liquid crystal display, a plasma display, and an organic EL display. In particular, the substrate can be used preferably for a liquid crystal display.

The invention claimed is:
1. A substrate for a display device, comprising:
an inorganic glass; and
resin layers placed on both sides of the inorganic glass, wherein the thickness $d_g$ of the inorganic glass is 25 μm to 30 μm, a ratio $d_{rsum}/d_g$ between a total thickness $d_{rsum}$ of the resin layers and a thickness $d_g$ of the inorganic glass is 1.5 to 2.2, the resin layers are formed of a resin composition containing a polyethersulfon resin, a polycarbonate resin, an epoxy resin, an acrylic resin, or a polyolefin resin as a main component, an average coefficient of linear expansion at 170° C. of the substrate for a display device is 20 ppm ° $C.^{-1}$ or less, and a rupture diameter is 30 mm or less when the substrate for a display device is curved.

2. A substrate for a display device according to claim 1, wherein the resin layers on both sides of the inorganic glass are each composed of the same material, each have the same thickness, and a thickness of each of the resin layers is equal to the thickness of the inorganic glass.

3. A substrate for a display device according to claim 1, wherein a total thickness of the substrate for a display device is 150 μm or less.

4. A substrate for a display device according to claim 1, wherein a transmittance of the substrate for a display device is 85% or more.

5. A substrate for a display device according to claim 1, wherein the resin layers are formed of a resin composition containing an epoxy resin as a main component.

6. A substrate for a display device according to claim 1, wherein a Young's modulus at 25 ° C. of the resin layers are 1 GPa or more.

7. A substrate for a display device according to claim 1, wherein the resin layers are directly provided on the inorganic glass.

* * * * *